(12) United States Patent
Yamartino et al.

(10) Patent No.: US 6,635,577 B1
(45) Date of Patent: *Oct. 21, 2003

(54) METHOD FOR REDUCING TOPOGRAPHY DEPENDENT CHARGING EFFECTS IN A PLASMA ENHANCED SEMICONDUCTOR WAFER PROCESSING SYSTEM

(75) Inventors: John M. Yamartino, Palo Alto, CA (US); Peter K. Loewengardt, San Jose, CA (US); Kenlin Huang, Milpitas, CA (US); Diana Xiaobing Ma, Saratoga, CA (US)

(73) Assignee: Applied Materials, Inc, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/280,462

(22) Filed: Mar. 30, 1999

Related U.S. Application Data

(60) Provisional application No. 60/126,837, filed on Mar. 30, 1999.

(51) Int. Cl.[7] ............................................. H01L 21/302
(52) U.S. Cl. ........................................ 438/706; 438/707
(58) Field of Search ................................ 438/706, 707; 156/345; 204/164, 31

(56) References Cited

U.S. PATENT DOCUMENTS

| 3,789,370 | A | * | 1/1974 | Bari et al. ................... 340/173 |
| 4,525,375 | A | * | 6/1985 | Hanak ............................ 427/8 |
| 4,699,689 | A |   | 10/1987 | Bersin ........................ 156/643 |
| 5,458,754 | A |   | 10/1995 | Sathrum et al. ........ 204/192.38 |
| 5,716,486 | A | * | 2/1998 | Selwyn et al. .............. 156/345 |
| 5,736,732 | A | * | 4/1998 | Possin et al. ............... 250/208 |
| 5,750,011 | A | * | 5/1998 | Ohmi et al. ................. 204/164 |
| 5,759,424 | A | * | 6/1998 | Imatake et al. ............... 216/60 |
| 5,765,073 | A | * | 6/1998 | Schoenbach et al. ......... 399/51 |
| 5,827,435 | A |   | 10/1998 | Samukawa .................... 216/69 |
| 5,844,282 | A | * | 12/1998 | Noguchi ...................... 257/356 |
| 6,048,434 | A | * | 4/2000 | Tamura et al. ......... 156/345.52 |
| 6,255,223 | B1 | * | 7/2001 | Matsuda et al. ............ 438/716 |

FOREIGN PATENT DOCUMENTS

| DE | 41 28 780 A1 | 3/1992 | ............. C23F/4/00 |
| EP | 0 559 233 A1 | 9/1993 | ............. H01J/37/02 |
| GB | 2 313 574 A | 12/1997 | ............. H01J/37/32 |

* cited by examiner

*Primary Examiner*—Kin-Chan Chen
(74) *Attorney, Agent, or Firm*—Moser Patterson & Sheridan; Joseph Bach

(57) ABSTRACT

A method of eliminating charging resulting from plasma processing a semiconductor wafer comprising the steps of plasma processing the semiconductor wafer in a manner that may result in topographically dependent charging and exposing, during at least a portion of a time in which the semiconductor wafer is being plasma processed, the semiconductor wafer to particles that remove charge from the semiconductor wafer and reduce topographically dependent charging.

21 Claims, 2 Drawing Sheets

METHOD FOR REDUCING TOPOGRAPHY DEPENDENT CHARGING EFFECTS IN A PLASMA ENHANCED SEMICONDUCTOR WAFER PROCESSING SYSTEM

CROSS REFERENCE TO A RELATED APPLICATION

This application contains subject matter that is related to U.S. Provisional Patent Application Ser. No. 60/26837 filed Mar. 30, 1999, filed simultaneously herewith, entitled "METHODS FOR ENHANCING PLASMA PROCESSING PERFORMANCE".

BACKGROUND OF THE DISCLOSURE

1. Field of the Invention

The invention relates to semiconductor wafer processing systems and, more particularly, the invention relates to a method of reducing topography dependent charging effects in a plasma enhanced semiconductor wafer processing system.

2. Description of the Background Art

As structures fabricated upon semiconductor wafers are reduced in size, charging damage has become a serious problem. Charging damage generally occurs when structures being formed on a semiconductor wafer using a plasma enhanced process cause non-uniform charging of the structures such that a differential voltage is formed on the structures. Such a differential voltage can produce high currents or arcing in the structure that damages the structure. For example, a plasma etch process can damage the gate oxide of a transistor structure due to a Fowler-Nordheim current produced by structure charging.

Electron shading is one of-the main contributors to structure charging. Electron shading is caused by the formation of structures having a dense line pattern having a high aspect ratio. Electron shading results from the isotropic movement of electrons in a process chamber during plasma processing versus the anisotropic movement of ions contained in the plasma. The electrons impact the sidewalls and other vertical surfaces of the structures and charge the structures. However, a high aspect ratio of these structures causes portions near the plasma to be impacted by more electrons than the "deep" portions of the structure. As such, the "shading" of the deep portions results in a voltage differential over the structure. Such structure charging may result from the use of any plasma process to process a wafer. As a result, many plasma processes are capable of causing topography dependent charging damage of structures on a semiconductor wafer. Topography dependent charging impacts many aspects of semiconductor wafer processing including: electron shading damage, notching, loss of profile control, aspect ratio dependent etching, etch stop, microloading, decreased photoresist selectivity, photoresist striations, and decreased etch rate.

Therefore, a need exists in the art for a method of reducing topography dependent charging.

SUMMARY OF THE INVENTION

The disadvantages associated with the prior art are overcome by the present invention of a method for reducing topography dependent charging damage. The method comprises the steps of exposing a semiconductor wafer comprising a structure to a plasma that causes the structure to experience electric charging, then exposing the semiconductor wafer to a particle source that removes the electric charge from the structure. By discharging the structure in this manner, the structure will not experience charging damage. One embodiment of the invention exposes the wafer to ultraviolet light as a source of particles (photons), while another embodiment of the invention exposes the wafer to a plasma of ions. The exposure to particles may occur continuously during the plasma processing of the wafer or during periods when the plasma processing is expected to cause charging damage.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
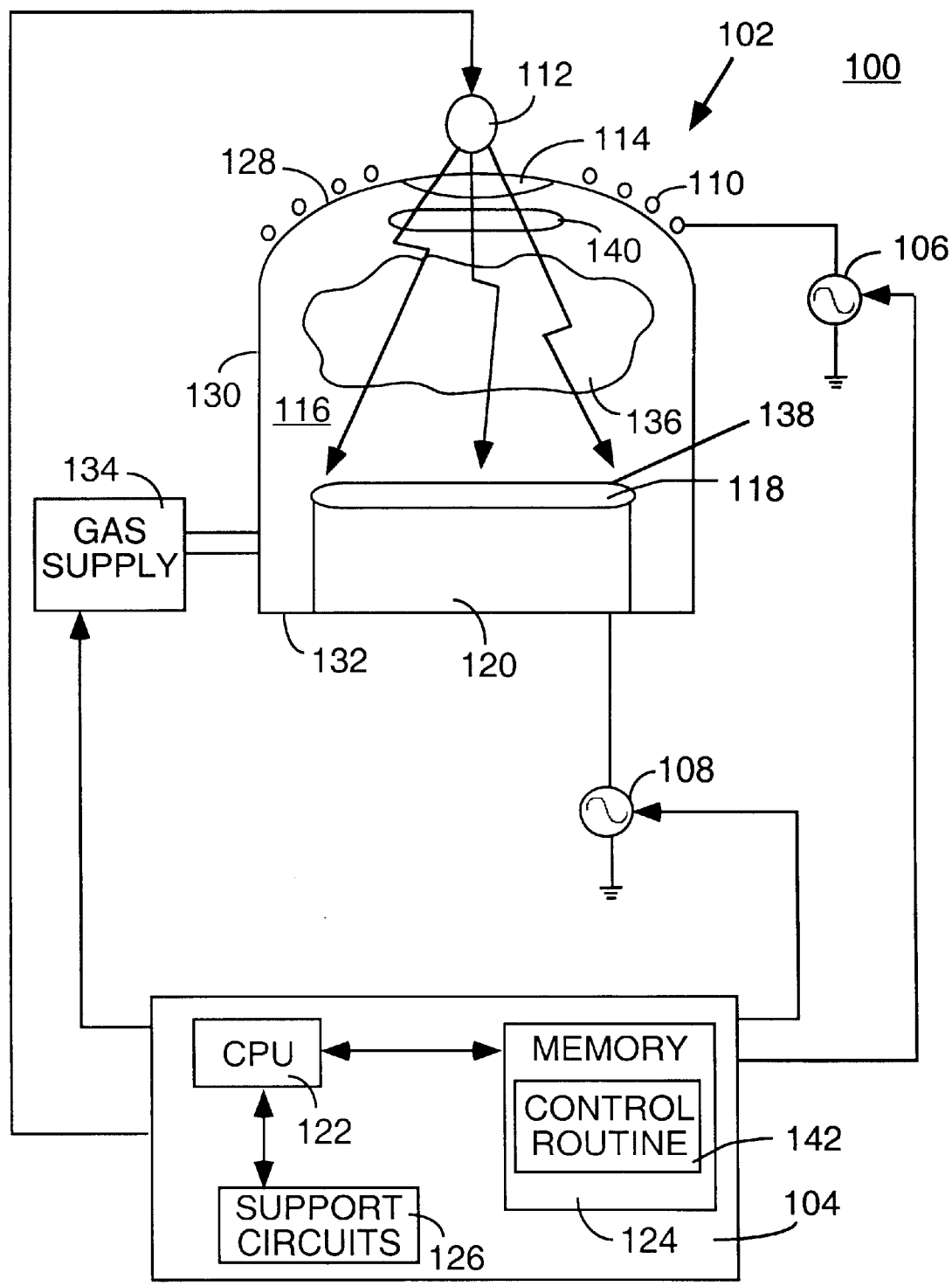
FIG. 1 depicts a schematic view of an illustrative semiconductor wafer processing chamber that is used to practice the present invention.

FIG. 1 depicts a schematic diagram of a plasma enhanced semiconductor wafer processing system 100. The depicted system is illustratively an inductively coupled plasma etch system. The invention, however, is applicable to any plasma enhanced semiconductor wafer processing system such as systems that perform plasma enhanced chemical vapor deposition, physical vapor deposition, plasma annealing, and the like. In short, the invention would benefit any system that may cause topographically dependent charging of structures upon a semiconductor wafer.

The system 100 comprises a process chamber 102, a source power supply 106, a bias power supply 108, and a controller 104. The process chamber 102 comprises a pedestal 120, an antenna 110, a light source 112, a gas supply 134 and a process volume 116 defined by a top 128, a cylindrical sidewall 130, and a bottom 132. The source power supply 106 couples an RF signal (e.g., 2 MHz) to the antenna 110. The antenna 110, having a plurality of turns located proximate the top 128, produces an RF magnetic field that excites a process gas (or gases) (e.g., chlorine) located in the volume 116 to form a plasma 136. A semiconductor wafer 118 containing integrated circuit structures 138 that are susceptible to charging damage is supported upon the pedestal 120. The wafer 118 is exposed to the plasma to facilitate processing of the wafer 118. The pedestal and thus the wafer is biased by an RF signal (e.g., 13.56 MHz) supplied to the pedestal 120 by the bias power supply 108.

In the first embodiment of the invention, a light source 112 forms a source of particles that are emitted into the volume 116 to impact the wafer 118. The light source 112 is one or more lamps that emit ultra-violet light. One such lamp is a Mercury capillary lamp. Other lamps are also available that produce photons of sufficient energy. The photons may be in the infrared, visible, ultraviolet, vacuum ultraviolet bands of the electromagnetic spectrum. Additionally, the energy or number of photons may be tuned (adjusted) to optimize charge removal during particular processes. Also, the source of particles can be modulated to temporally vary the intensity, energy, or number of particles. Additionally, specific chemistries may be added to the plasma region or presently used gases can be increased to enhance the emission of the plasma at a desired wavelengths.

In the illustrative embodiment, a single lamp 112 positioned at the top 128 of the chamber 102 proximate a window 114 that is transparent to ultra-violet light. The photons (represented by arrows 140) from the lamp 112 pass through the window 114 and into the volume 116. The photons impact the structures 138 and remove electric charge that has accumulated upon the structures. The lamp 112 may illuminate the wafer 118 during entire period of plasma processing or the illumination may be used only during periods of processing that are expected to result in charging effects.

Controller 104 provides automated control of the system 100. The controller 104 comprises a central processing unit (CPU) 122 that is connected to a memory 124 and support circuits 126. The controller 104 is a general purpose computer that, when executing certain programs stored in the memory 124, becomes a specific purpose computer. Memory 124 may be random access memory, read only memory, disk drive storage, or any other form of storage that is used to store a digital program or any combination thereof. The support circuits 126 are well known elements of a computer including cache, power supplies, clock circuits, buses, and the like. The method of the present invention may be embodied in whole or in part in a program 142 that is stored in the memory 104. Although shown as embodied as a software program, the method of the present invention may comprise steps that are performed by software, hardware or a combination thereof.

Figure 2:
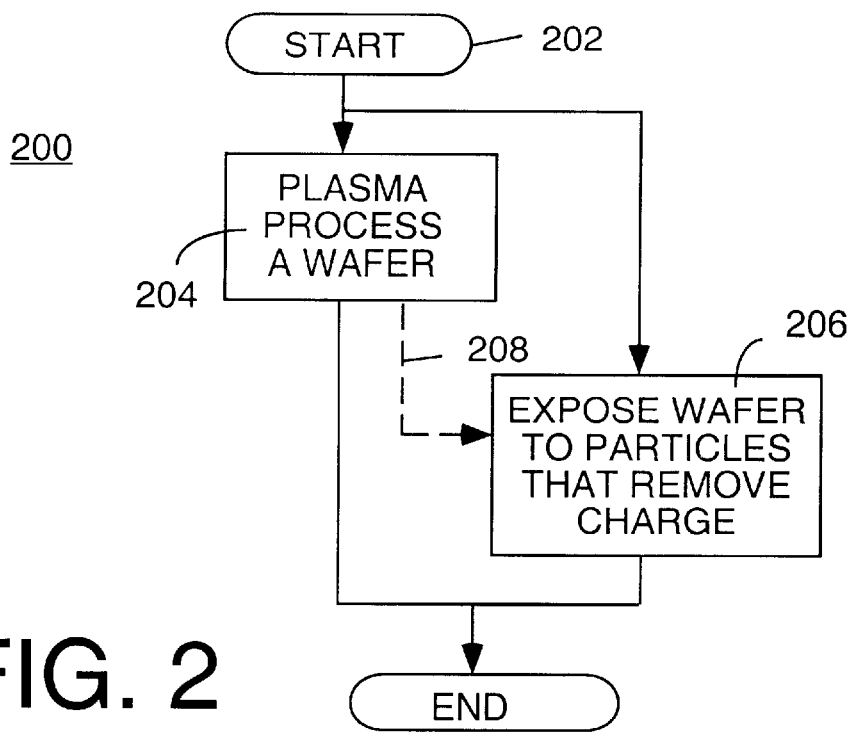
FIG. 2 depicts a flow diagram representing a first embodiment of the present invention.

FIG. 2 depicts a flow diagram of a routine 200 of a first embodiment of the present invention. The routine begins at step 202 and proceeds to step 204 wherein a wafer is processed by a plasma that has been excited in the process chamber. Those skilled in the art will realize that a plurality of steps are necessary to excite a plasma in a process chamber, i.e., supply a process gas, apply source power to the antenna, apply bias power to the pedestal and so on. These steps are well within the skill in the art to perform without further explanation.

Once a plasma is excited, the wafer begins to be processed in a manner that may lead to topographically dependent charging, e.g., metal is etched from the wafer to form a line pattern that can experience charging. The routine of the first embodiment activates a particle generator throughout the wafer processing period, e.g., an ultraviolet lamp is active such that the wafer is illuminated with high energy photons. The particles, for example, photons, remove any charge on the structures being formed such that topographically dependent charging is reduced.

Another source of photons may be the process plasma itself or an electron beam that is injected into the source region of the chamber to excite specific transitions in the process gases to emit certain wavelengths of light. To enhance the photons emitted by the plasma, chemicals (gaseous or otherwise) can be added to the plasma such that additional photons and/or photons having higher energy are emitted from the plasma.

Other particles that are effective in removing the structure charge include ions that are produced in the plasma that is formed to process the wafer. To produce ions with sufficient energy to remove charge from the structures, the ions are generally accelerated by increasing the bias power above the power level that is generally used to etch or otherwise process the wafer. Additionally, a special gas or gases can be added to the process plasma to facilitate generation of ions that remove structure charge during wafer processing. Also, the charge removal particles may be formed in a remote plasma source and channeled into the process chamber. The particles may be accelerated toward the structure on the wafer through wafer biasing or other ion acceleration techniques. Generally speaking, the scope of the invention is considered to encompass any source of particle or energy that removes charge from a structure on a semiconductor wafer. At step 208, the process stops and the routine awaits the next wafer that is to be processed.

Figure 3:
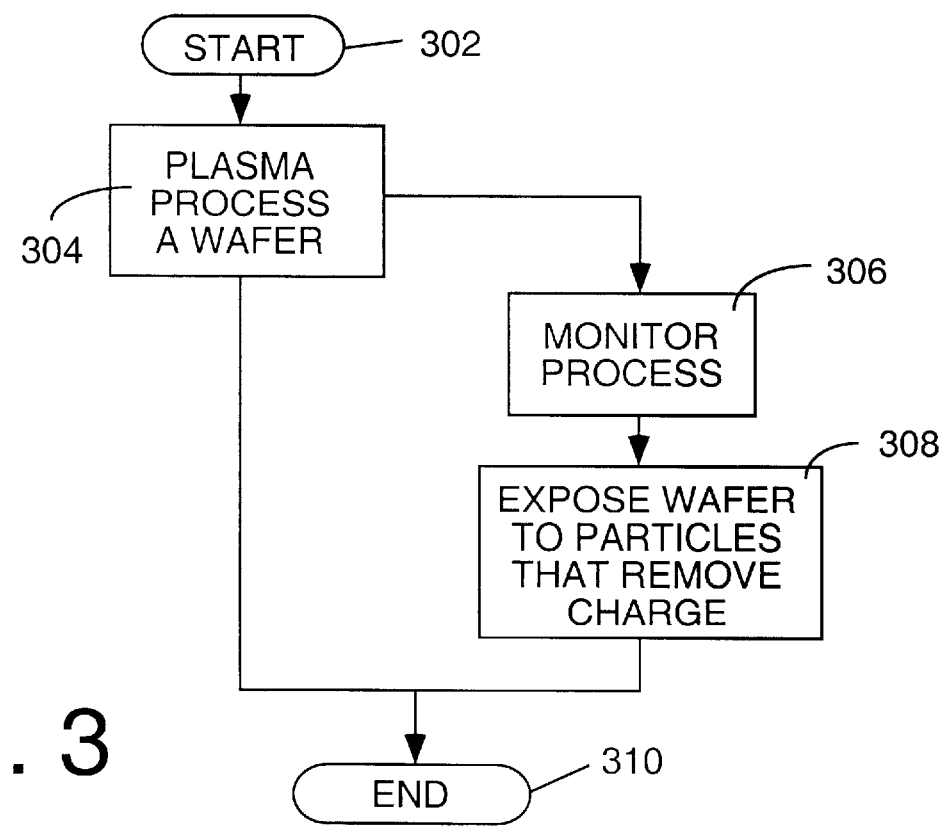
FIG. 3 depicts a flow diagram of an alternative embodiment of the invention.

FIG. 3 depicts a flow diagram of a routine 300 of the second embodiment of the invention. The routine 300 begins at step 302 and proceeds to step 304 wherein the wafer is processed. As the wafer is processed, the process progression is monitored at step 306 using optical emission spectroscopy or another process monitoring technique. When the process monitoring technique determines that a period in the process-is approaching that may cause charging damage, e.g., the transition from main etch to over etch in an metal etch system, the routine 300 activates at step 308 the particle source to remove the charge on the structures. As such, the particle generator, e.g., an ultra-violet lamp, is activated only when charging damage is expected to occur. The routine ends at step 310. This second embodiment of the invention selects certain time periods to apply the charge removing particles (a temporal selection); however, the particles can also be applied geometrically selective manner such that particles are focused upon certain portions of the structures to selectively discharge the structure. It is also within the scope of this invention to remove charge from the wafer in a post-plasma processing treatment where applicable. As such, the wafer would be exposed to particles that remove the charge after the plasma processing of the wafer has been completed. Such a process is represented by the dashed arrow 208 in FIG. 2.

In one specific application of the invention, a 3 kW mercury lamp was coupled to a window located in the center of the dome of a DPS etch reactor manufactured by Applied Materials, Inc. The process recipe used to etch an aluminum stack after 80 percent of main etch was:

Chamber pressure: 40 mT
Bias power: 400 Watts
Source Power: 600 Watts
Process gases: $Cl_2/BCl_2/Ar$ When the UV lamp was active during the entire etch process, the use of UV illumination resulted in a significant number of dies on a wafer being undamaged as compared to the process without illumination. Other possible improvements include decreased ARDE effects, improved etch selectivity due to photoresist hardening that occurs upon exposure of the photoresist mask to UV light as the photoresist is etched, decreased oxide striation due to hardened photoresist, increased etch rate and a decrease of malformed structures.

Although an etch process was described as an illustrative example of using the invention to reduce topographically dependent charging effects, the invention finds use in any process that produces topographically dependent charging effects. For example, such charging effects are known to occur in gap filling processes.

Although various embodiments which incorporate the teachings of the present invention have been shown and described in detail herein, those skilled in the art can readily devise many other varied embodiments that still incorporate these teachings.

What is claimed is:

1. A method of processing a semiconductor wafer comprising the steps of:

providing a semiconductor wafer to a process chamber, wherein the semiconductor wafer has a topographic structure thereon;

exposing the semiconductor wafer to a plasma in the process chamber;

monitoring the plasma using spectroscopy to determine when a period is approaching that may cause charge damage to the semiconductor wafer; and illuminating the semiconductor wafer with light in response to a determination that the period is approaching that may cause charge damage to the semiconductor wafer to remove electrical charge therefrom.

2. The method of claim 1 wherein the light is produced by a light source, other than the plasma to which the semiconductor wafer is exposed.

3. The method of claim 2 wherein the light source is a lamp.

4. The method of claim 2 wherein the energy of the light varies as a function of a power applied to the light source.

5. The method of claim 2 wherein the intensity of the light varies as a function of a power applied to the light source.

6. The method of claim 1 wherein the light is produced by adding at least one chemical to the plasma.

7. The method of claim 1 wherein the semiconductor wafer is illuminated with light only during a time period when the plasma may cause charge damage to the semiconductor wafer.

8. The method of claim 7 wherein the time period is a transition period between a main etch period and an over etch period.

9. The method of claim 7 wherein the time period is an over etch period.

10. The method of claim 7 wherein the time period is a post etch period.

11. The method of claim 1 wherein the light is selected from at least one band of the electromagnetic spectrum comprising infrared, ultraviolet, visible, and vacuum ultraviolet bands.

12. A method of processing a semiconductor wafer comprising the steps of:

providing a semiconductor wafer to a process chamber, wherein the semiconductor wafer has a topographic structure thereon;

exposing the semiconductor wafer to a plasma in the process chamber;

monitoring the plasma using spectroscopy to determine when a period Is approaching that may cause charge damage to the semiconductor wafer; and illuminating the semiconductor wafer with light in response to a determination that the period is approaching that may cause charge damage to the semiconductor wafer to remove electrical charge therefrom, wherein the semiconductor wafer is illuminated while being exposed to the plasma.

13. The method of claim 12 wherein the light is produced by a light source, other than the plasma to which the semiconductor wafer is exposed.

14. The method of claim 13 wherein the light source is a lamp.

15. The method of claim 13 wherein the light is produced by adding at least one chemical to the plasma.

16. The method of claim 13 wherein the semiconductor wafer is illuminated only during a time period when the plasma may cause charge damage to the semiconductor wafer.

17. The method of claim 16 wherein the time period is a transition period between a main etch period and an over etch period.

18. The method of claim 16 wherein the time period is an over etch period.

19. The method of claim 13 wherein the light is selected from at least one band of the electromagnetic spectrum comprising infrared, ultraviolet, visible, and vacuum ultraviolet bands.

20. The method of claim 13 wherein the intensity of the light varies as a function of a power applied to the light source.

21. The method of claim 13 wherein the energy of the light varies as a function of a power applied to the light source.

* * * * *